(12) United States Patent
Ni et al.

(10) Patent No.: US 7,517,252 B2
(45) Date of Patent: Apr. 14, 2009

(54) THIN SOLID STATE DRIVE HOUSING STRUCTURES

(75) Inventors: Jim Chin-Nan Ni, San Jose, CA (US);
Siew Sin Hiew, San Jose, CA (US);
Abraham Chih-Kang Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 11/966,827

(22) Filed: Dec. 28, 2007

(65) Prior Publication Data

US 2008/0192425 A1 Aug. 14, 2008

Related U.S. Application Data

(63) Continuation-in-part of application No. 11/929,917, filed on Oct. 30, 2007, which is a continuation-in-part of application No. 10/990,887, filed on Nov. 16, 2004, now Pat. No. 7,301,776, application No. 11/966,827, filed on Dec. 28, 2007, which is a continuation-in-part of application No. 11/309,843, filed on Oct. 11, 2006, which is a continuation-in-part of application No. 09/478,720, filed on Jan. 6, 2000, now Pat. No. 7,257,714.

(51) Int. Cl.
*H01R 24/00* (2006.01)

(52) U.S. Cl. ........................ 439/630; 361/684

(58) Field of Classification Search ................. 439/630, 439/631, 76.1, 159; 174/52.1; 361/737, 361/818, 683, 684
See application file for complete search history.

(56) References Cited

U.S. PATENT DOCUMENTS

| | | | | |
|---|---|---|---|---|
| 5,477,421 A * | 12/1995 | Bethurum | ................... | 361/818 |
| 5,481,434 A * | 1/1996 | Banakis et al. | ............... | 361/756 |
| 5,768,110 A * | 6/1998 | Frommer et al. | ............ | 361/755 |
| 6,191,950 B1 * | 2/2001 | Cox et al. | ................... | 361/737 |
| 2002/0159239 A1 * | 10/2002 | Amie et al. | ................. | 361/737 |
| 2002/0160661 A1 * | 10/2002 | Florescu | ..................... | 439/630 |

* cited by examiner

*Primary Examiner*—Alexander Gilman
(74) *Attorney, Agent, or Firm*—Roger H. Chu

(57) ABSTRACT

Thin solid state drive (SSD) housing structures are described. According to one embodiment of the invention, a structure for housing an SSD includes a pair of brackets configured to support a PCBA of the SSD at either side of the PCBA via one or more ledges with corresponding fastener holes pre-configured thereon. The ledges are attached to inside surface of the brackets. Each of the brackets has a slab shape with a length and a height. The length is parallel to horizontal direction, while the height parallel to vertical. The ledges are located at mid-height and orientated substantially perpendicular to the brackets such that the PCBA is supported horizontally. In order to securely connect the PCBA with the brackets, a plurality of metal fasteners is used. The fasteners are placed through the fastener holes on the ledges and through corresponding alignment holes pre-configured on the PCBA.

14 Claims, 9 Drawing Sheets

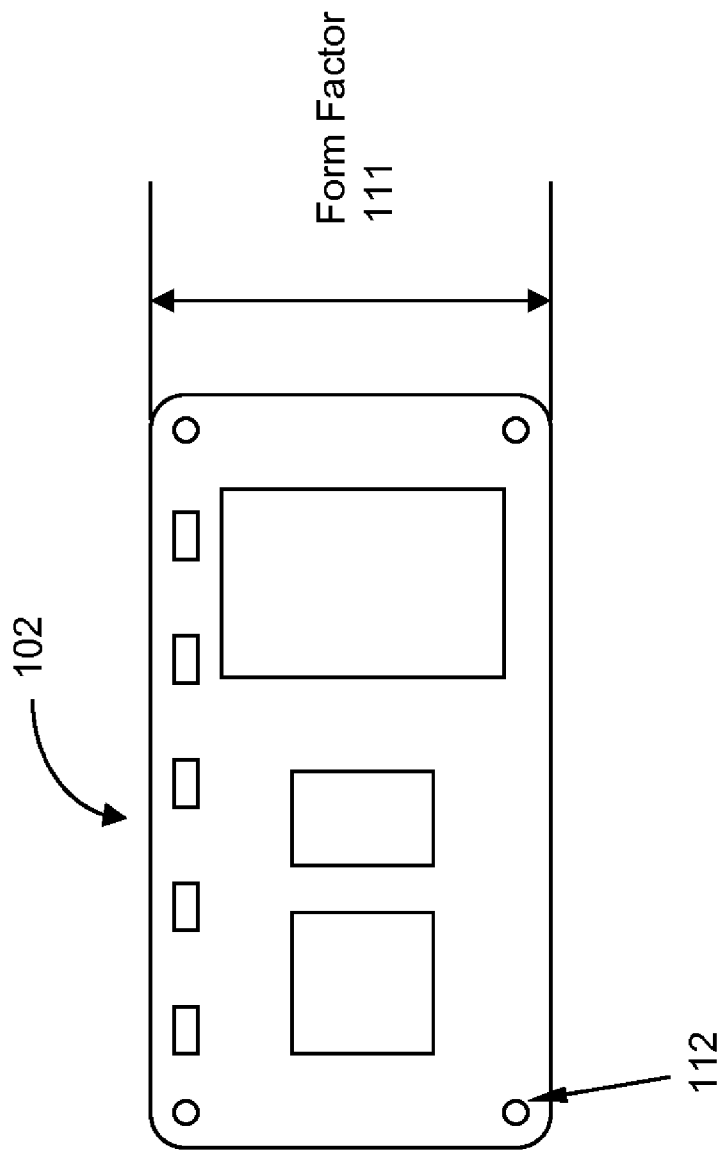

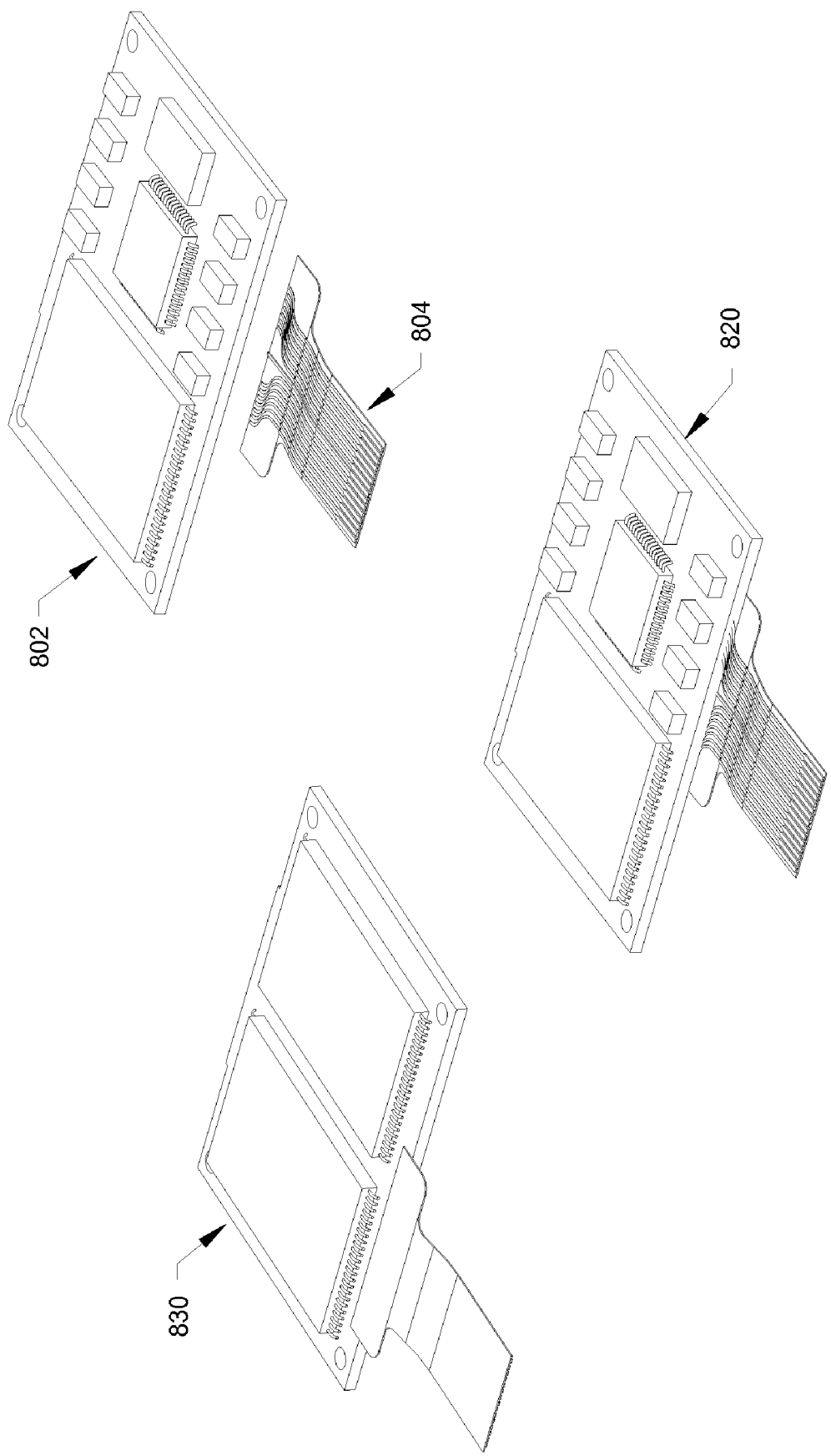

THIN SOLID STATE DRIVE HOUSING STRUCTURES

CROSS-REFERENCE TO RELATED APPLICATIONS

This application is a continuation-in-part (CIP) of co-pending U.S. patent application Ser. No. 11/929,917, entitled "Solid State Drive (SSD) with Open Top and Bottom Covers" filed on Oct. 30, 2007, which is a CIP of U.S. patent application Ser. No. 10/990,887 for "Light-Weight Flash Hard Drive With Plastic Frame", filed on Nov. 16, 2004, now U.S. Pat. No. 7,301,776 issued on Nov. 27, 2007.

This application is also a CIP of co-pending U.S. patent application Ser. No. 11/309,843, entitled "Thin Flash-Hard-Drive with Two-Piece Casing", filed on Oct. 11, 2006, which is a CIP of U.S. patent application Ser. No. 09/478,720, entitled "Electronic Data Storage Medium with Fingerprint Verification Capability", filed on Jan. 6, 2000, now U.S. Pat. No. 7,257,714, issued on Aug. 14, 2007.

FIELD OF THE INVENTION

The present invention relates to solid state drives (SSD), and more particularly to housing structures for the solid state drives that are used in conjunction with consumer electronic devices such as camera, camcorder, cellular phone, personal multimedia player, personal digital assistant, etc.

BACKGROUND OF THE INVENTION

With proliferations of non-volatile memory such as flash memory, some of the consumer electronic devices that traditionally use hard disk drive as data storage have another option—solid state drive (SSD). The SSD is a data storage device that uses non-volatile memory to store persistent data. The SSD emulates conventional hard disk drive, thus easily replacing it almost any application. Because non-volatile memory comprises semiconductor devices without moving parts, traditional mechanical characteristics of seek time, latency and other electro-mechanical delays and failures associated with a conventional hard disk drive have largely been eliminated.

FIG. 1A is a perspective view of an SSD core unit 100. The SSD core unit includes a printed circuit board assembly (PCBA) 102 and an interface connector 104. In general, the PCBA 102 of the SSD core unit 100 includes a PCB and one or more non-volatile memory (i.e., flash memory) chips, a controller, and other components such as capacitors, resistors, etc. Optionally several alignment holes 112 are pre-configured in the four corners of the PCB. Additionally, a plurality of contact pads 113 is disposed on one of the surfaces of the PCBA 102. These pads 113 are configured to be connected to the connector 104, which is configured to provide as an interface with outside hosting devices (e.g., a computer, a consumer electronic device, etc.). The interface connector 104 is configured to transmit data, power and control signals, to and from a host device. Once assembled, bottom and top perspective views of the SSD core unit 100 are shown in view 120 and 130, respectively. The PCBA 102 of the core unit 100 is identified by a form factor 111 as shown in FIG. 1B. The form factor 111 equals to the approximate length of the PCBA side. For example, a one inch form factor is substantially equal to 1.181 inches.

In order to properly deploy the SSD core unit 100 with a consumer electronic device, the SSD core unit 100 needs to satisfy various requirements imposed by each specific type of the consumer electronic devices. For example, limited internal space, weight restriction, particular dimensions, special cooling requirement, different connection types, portable storage, etc.

Therefore, it would be desirable to have various housing structures for an SSD core unit to meet specific requirements of hosting consumer electronic devices.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Thin solid state drive (SSD) housing structures are disclosed. According to one aspect of the present invention, a structure for housing an SSD includes a pair of brackets configured to support a printed circuit board assembly (PCBA) of the SSD core unit at either side of the PCBA via one or more ledges with corresponding fastener holes pre-configured thereon. The ledges are attached to inside surface of the brackets. The brackets may be made of sheet metal plate and each bracket has a slab shape with a length and a height. The length is parallel to horizontal direction, while the height parallel to vertical direction. The one or more ledges are located at mid-height and orientated substantially perpendicular to the brackets such that the PCBA is supported horizontally. In order to securely connect the PCBA with the brackets, a plurality of fasteners (e.g., screws) is used. The fasteners are placed through the fastener holes on the one or more ledges and through corresponding alignment holes pre-configured on the PCBA. For example, four alignment holes are pre-drilled near four corners of the PCBA.

According to another aspect of the present invention, ventilation air can flow through the SSD core unit (i.e., the PCBA and the connector) without other structural obstructions, since there is only a pair of brackets supporting the SSD. Therefore, the SSD employing this type of housing structure can be deployed in an interior space of consumer electronic devices to meet cooling requirements.

According to yet another aspect of the present invention, the alignment holes may be configured as grounding holes, when the alignment holes are drilled through grounding plane of the PCBA. An electric current path between the PCBA and the metal brackets is formed, when at least one of the metal screws are inserted into the alignment holes. This arrangement reduces the probability of electrostatic discharge damage to the electronic components mounted on the PCBA.

According to yet another aspect of the present invention, the brackets may be made of plastic material instead of metal to further reduce weight if such requirement is desired in the host consumer electronic device.

According to yet another aspect of the present invention, top and bottom covers may be added to the brackets for those applications that require protection of the SSD core unit all surrounding space.

According to yet another aspect of the present invention, an opening for accessing the interface connector is provided in the housing structure. The interface connector is based on one of the industry standards including, but not necessarily limited to, Commercial Electronics—Advanced Technology Attachment (CE-ATA), flat flex cable (FFC) or other equivalent standards suitable for consumer electronic devices.

One of the objects, features, and advantages of the present invention is to allow SSD core units to be used in conjunction with any consumer electronic device either internally or externally. Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 1B is a diagram illustrating form factor of the PCBA of FIG. 1A.

FIG. 8 shows perspective views of a PCBA of an SSD core unit with an alternative connector (i.e., a flat flex cable connector).

DETAILED DESCRIPTION

Figure 1A:
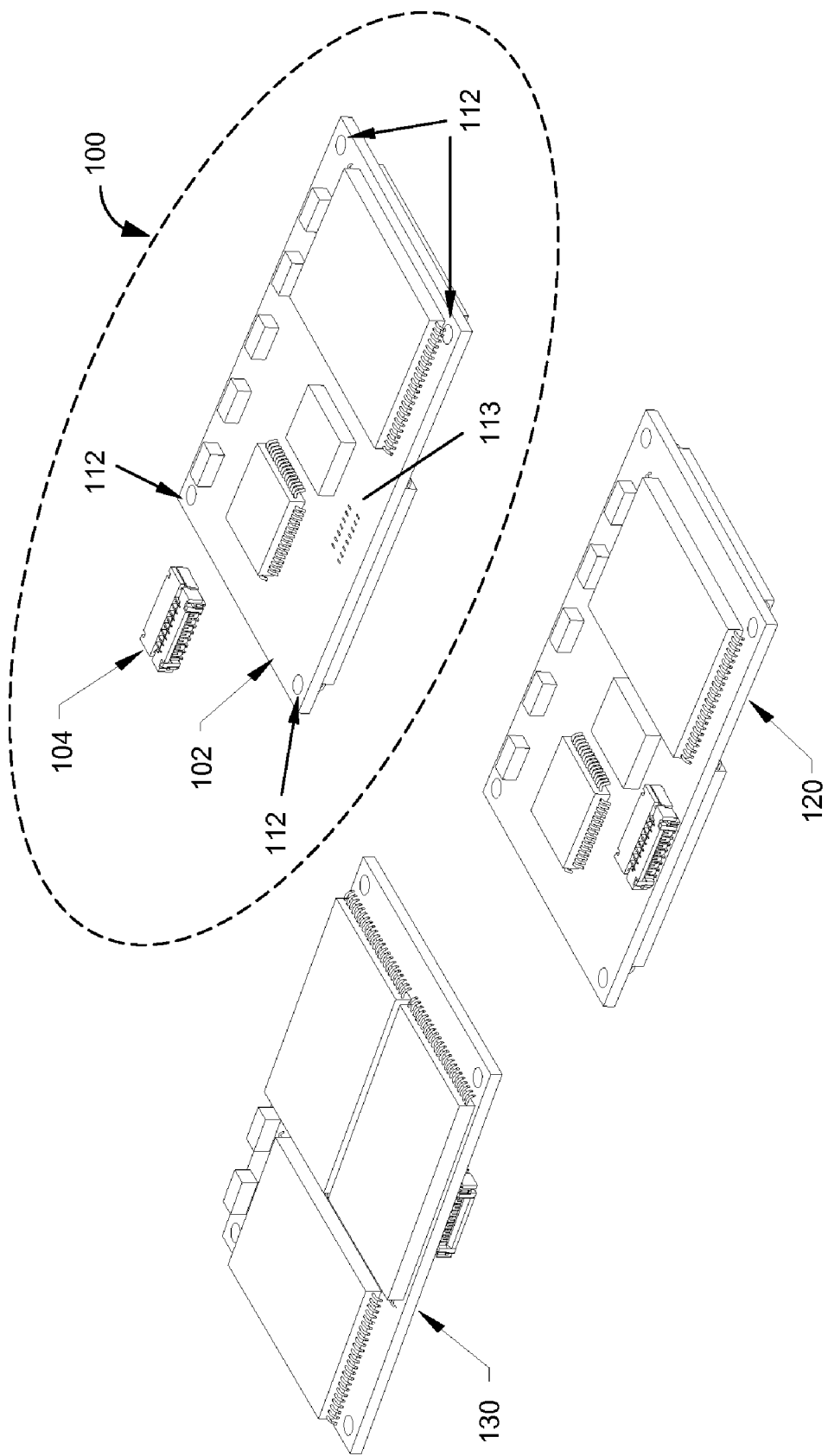
FIG. 1A shows perspective views of a solid state drive (SSD) core unit (i.e., a printed circuit board assembly (PCBA) and a connector.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "front", "back", "rear", "side", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Embodiments of the present invention are discussed herein with reference to FIGS. 2-8. However, those skilled in the art will readily appreciate that the detailed description given herein with respect to these figures is for explanatory purposes as the invention extends beyond these limited embodiments.

Referring now to the drawings, in which like numerals refer to like parts throughout several views. FIG. 2 shows exploded and assembled perspective views of an exemplary housing structure with the solid state drive (SSD) core unit 100 of FIG. 1A mounted thereon, in accordance with a first embodiment of the present invention. The housing structure comprises a pair of support brackets 204 and 206. Each of the support brackets 204 and 206 has a slab-shape with a length 201 in longitudinal direction and a height 202 in vertical direction. The pair of support brackets is configured for holding the core unit 100 through a pair of ledges or PCBA supports pre-configured with respective fastener holes 214 located substantially near longitudinal ends of each of the brackets 204 and 206. The respective pair of fastener holes 214 on the ledges is configured to be orientated substantially perpendicular to the longitudinal and vertical directions of each of the support brackets 204 and 206, such that the core unit 100 is supported on the ledges horizontally. The core unit 100 is connected to the pair of support brackets 204 and 206 via four fasteners 208 (e.g., screws) through corresponding alignment holes 112 (i.e., holes penetrating the core unit 100 through top and bottom surfaces) located at four corners of the core unit 100 and through the fastener holes 214 of the support brackets 204 and 206.

When the support brackets are made of metal (e.g., sheet metal), the fastener holes 214 may be made by cutting then folding a part of support brackets having a pre-punctuated or pre-drilled fastener holes into a desired orientation (i.e., substantially perpendicular to the longitudinal and vertical directions of the support brackets). The pair of support brackets 204 and 206 is fastened to support the core unit 100 in a mirror image orientation parallel with each other at either side of the core unit 100. Once the support brackets are connected to the core unit 100, an SSD is assembled and shown in a top 230 and a bottom 220 perspective view. Furthermore, since the alignment holes 112 of the core unit 100 cut through the PCBA grounding plane, an electric current path between the PCBA of the core unit 100 and the support brackets 204 and 206 is established as at least one of the metal screws 208 are inserted through the alignment holes 112. This reduces the probability of electrostatic discharge (ESD) damage to integrated circuits mounted on the PCBA of the core unit 100.

In the first embodiment, there is only a pair of support brackets 204 and 206 included in the housing structure, which is configured for supporting the SSD core unit 100 in a host consumer electronic device with very limited internal space that requires ventilation air flow through. Finally, each of the support brackets 204 and 206 has a length in the longitudinal direction 201 substantially equal to the form factor of the PCBA of the core unit 100. In one embodiment, the form factor may be 0.85-1.0 inch as shown in FIG. 1B.

Figure 2:
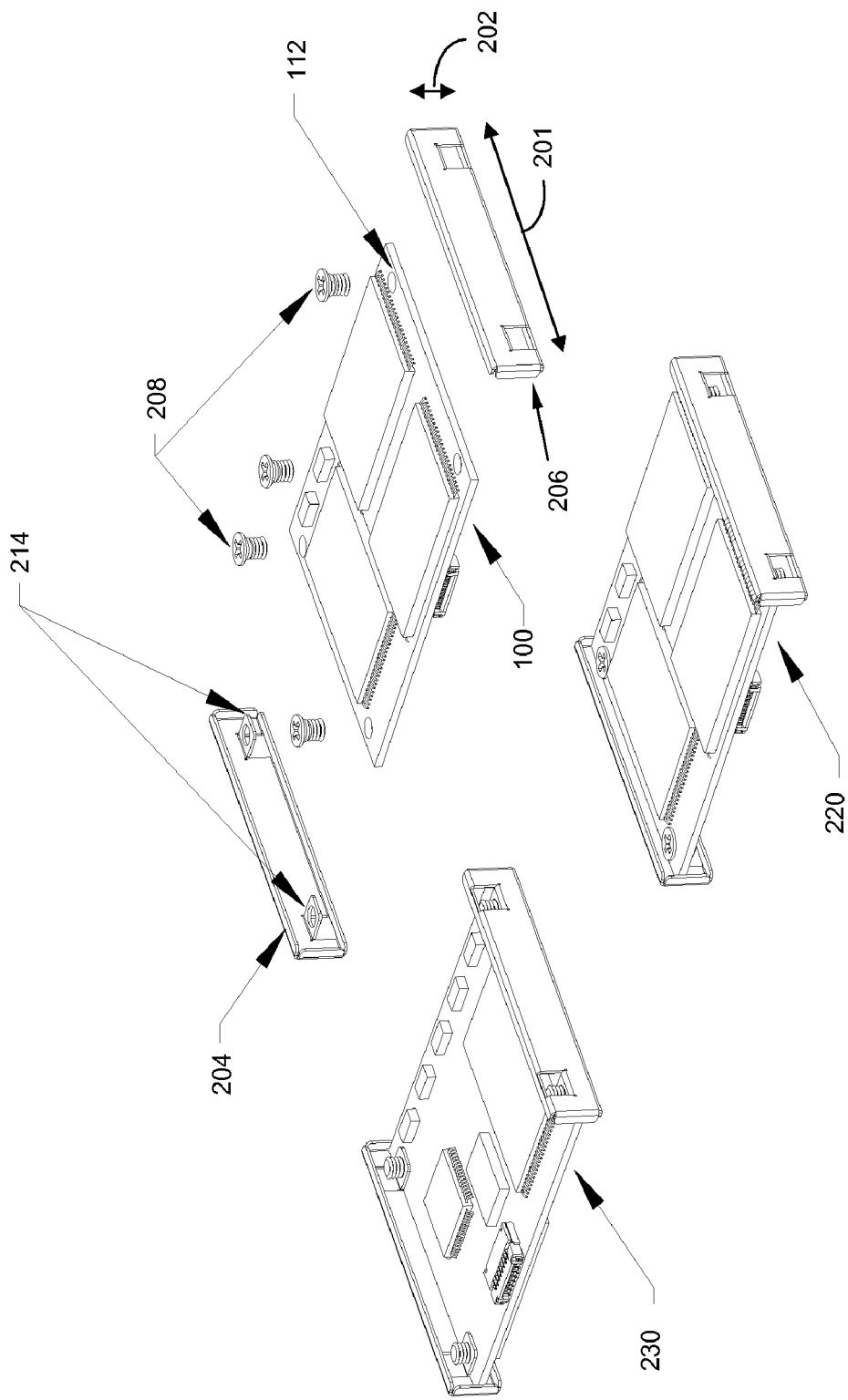
FIG. 2 shows exploded and assembled perspective views of an exemplary housing structure with the SSD core unit of FIG. 1A mounted thereon, according to a first embodiment of the present invention.
Figure 3:
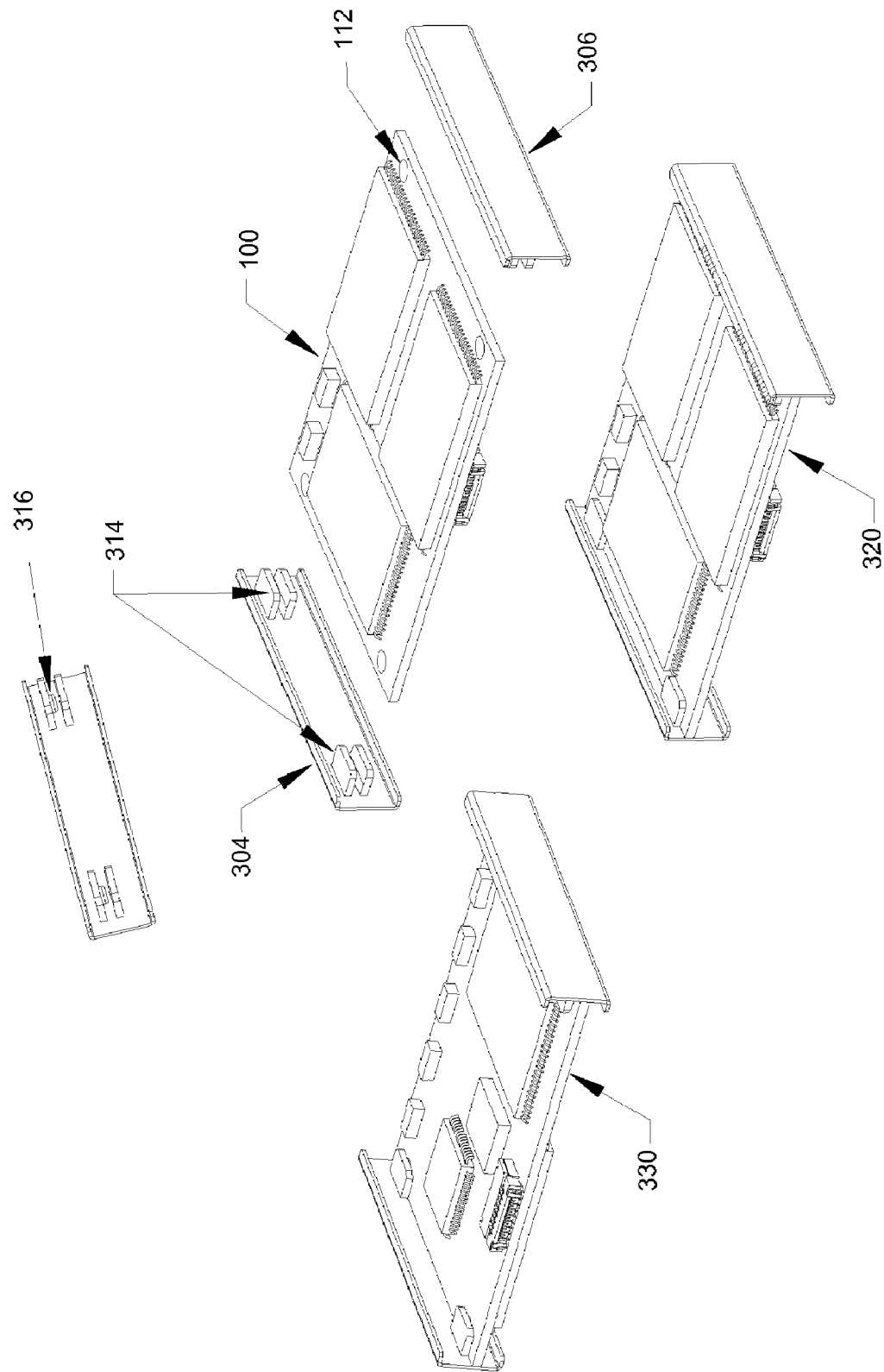
FIG. 3 shows exploded and assembled perspective views of another exemplary housing structure with the SSD core unit of FIG. 1A mounted thereon, according to a second embodiment of the present invention.

Shown in FIG. 3 is a perspective view of another exemplary housing structure and a solid state drive (SSD) core unit 100 of FIG. 1A mounted thereon, in accordance with a second embodiment of the present invention. The housing structure of the second embodiment includes two side support brackets 304 and 306. Each of the side support brackets 304 and 306 includes a pair of snap-on clamping means 314 with alignment protrusions 316 located in two longitudinal ends. Similar to the first embodiment, the support brackets 304 and 306 are fastened to the core unit 100 in a mirror image orientation. No screws are required for connecting the support brackets 304 and 306 to the core unit 100. The two support brackets 304 and 306 are aligned with and clamped on either side of the core unit 10 with respective snap-on clamping means 314. In order to secure the support brackets 304 and 306 with the core unit 100, the alignment protrusions 316 are aligned with the corresponding alignment holes 112 of the core unit 100 so that the protrusions 316 are snapped into the alignment holes 112 when fully assembled. Top and bottom perspective views of the fully assembled SSD according to the second embodiment are shown in views 330 and 320, respectively. Typically, the support brackets 304 and 306 of the second embodiment are manufactured with plastic material to further reduce the weight of the housing structure. The housing structure is suitable for mounting or installing SSD inside of a host consumer electronic device, in both the first and second embodiments.

Figure 4:
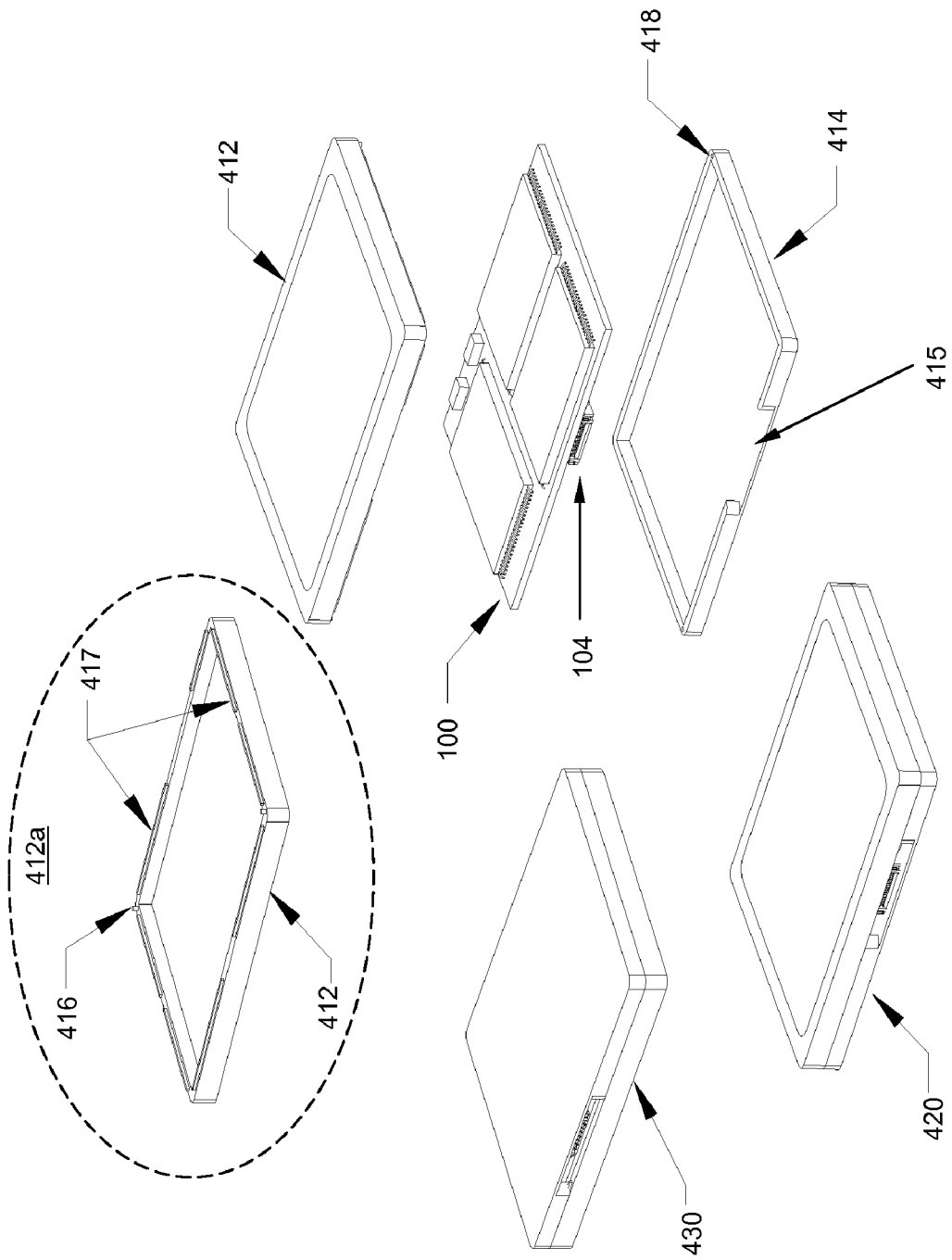
FIG. 4 shows exploded and assembled perspective views of yet another exemplary housing structure with the SSD core unit of FIG. 1A mounted thereon, according to a third embodiment of the present invention.

According to a third embodiment of the present invention, FIG. 4 is a perspective view of yet another exemplary housing structure and the SSD core unit 100 of FIG. 1A mounted thereon. Different from the first and second embodiments, the housing structure of the third embodiment is suitable for manufacturing an SSD for both external and internal usage.

The housing structure includes a top cover 412 and a bottom cover 414, both made of plastic materials. In a bottom view 412a of the top cover 412, four alignment posts 416 at corners and ultrasonic plastic bonders 417 along all perimeter edges (i.e., front, back, left and right edges) are shown. The bottom cover 414 includes four receptacle holes 418 at corners corresponding to the alignment posts 416. Also included in the bottom cover 414 is an opening 415 for the connector 104 access. To assemble the housing structure, the top 412 and bottom 414 covers are coupled together with the alignment posts 416 inserted into the respective alignment receptacles 418. Then an ultrasonic welding process forms a permanent seal between the top and bottom covers 412 and 414. In the ultrasonic welding process, the bonders 417 disposed on the perimeter edges of the top cover 412 are melted by ultra high frequencies thereby welding to the bottom cover 414. Once assembled, top and bottom perspective views of the SSD are shown in views 430 and 420, respectively. Furthermore, combined height of the top 412 and bottom 414 covers is so dimensioned that the core unit 100 is to be substantially fit inside without any slack space.

Figure 5:
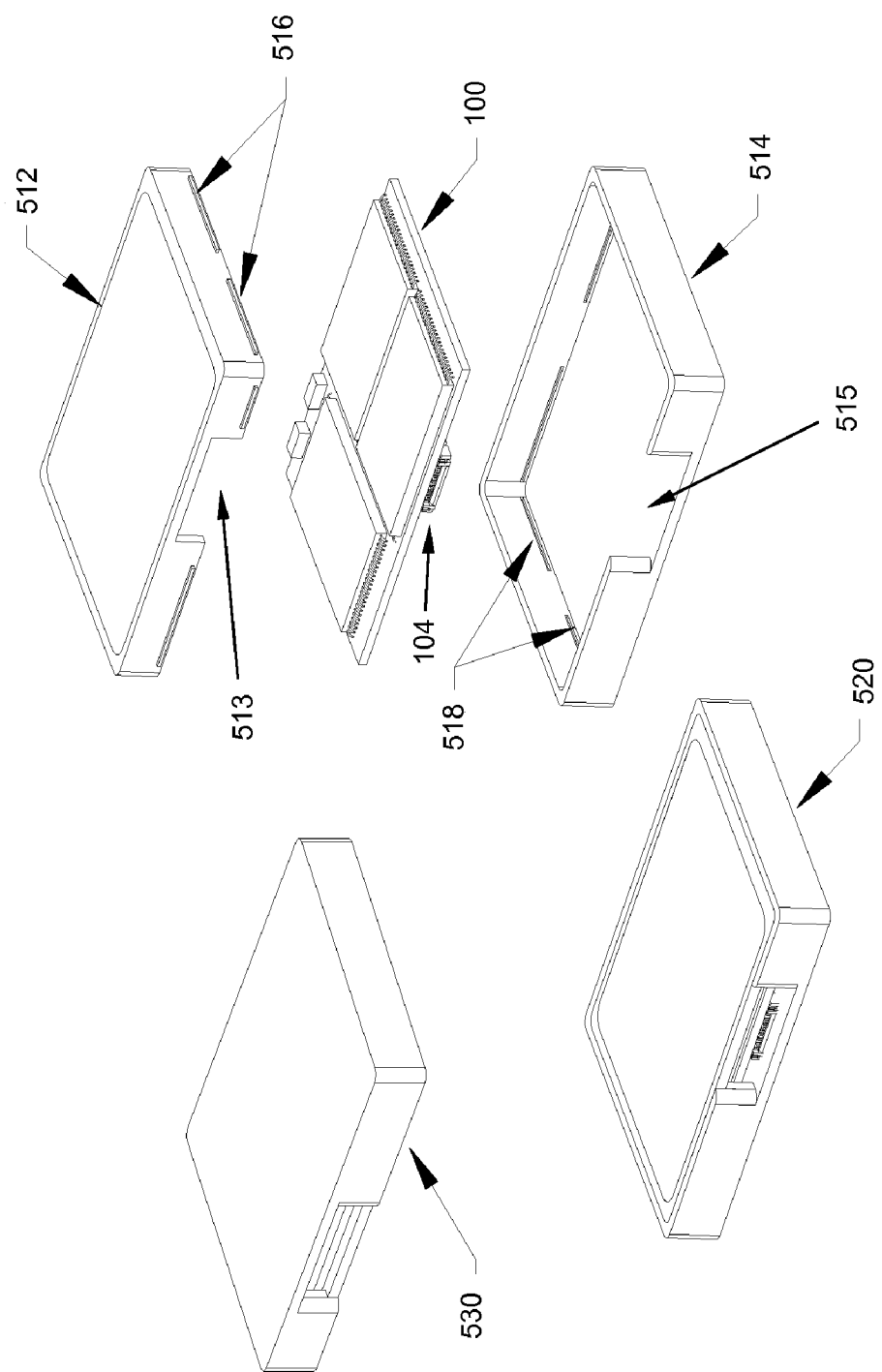
FIG. 5 shows exploded and assembled perspective views of yet another exemplary housing structure with the SSD core unit of FIG. 1A mounted thereon, according to a fourth embodiment of the present invention.

Alternatively, a fourth embodiment of the present invention is shown in FIG. 5, in which a perspective view of yet another exemplary housing structure and the SSD core unit 100 is illustrated. The housing structure of the fourth embodiment includes a top and bottom covers 512 and 514 similar to the third embodiment. Instead of using permanent ultrasonic welding process, the top 512 and bottom 514 covers are snap-coupled together using a plurality of snap-tabs 516 along outside perimeter edges of the top cover 512 and corresponding engagement slots 518 along inside perimeter edges of the bottom cover 514. The top cover 512 is so dimensioned that the core unit 100 can be substantially fit inside of the top cover 512 without any spare room left. The connector 104 access is provided by a pair of opposing openings (e.g., U-shape opening 515 and an up-side down U-shape opening 513) configured on the bottom 514 and top 512 covers, respectively. Again, top and bottom perspective views of the final assembled SSD of the fourth embodiment are shown in respective views 530 and 520.

Figure 6:
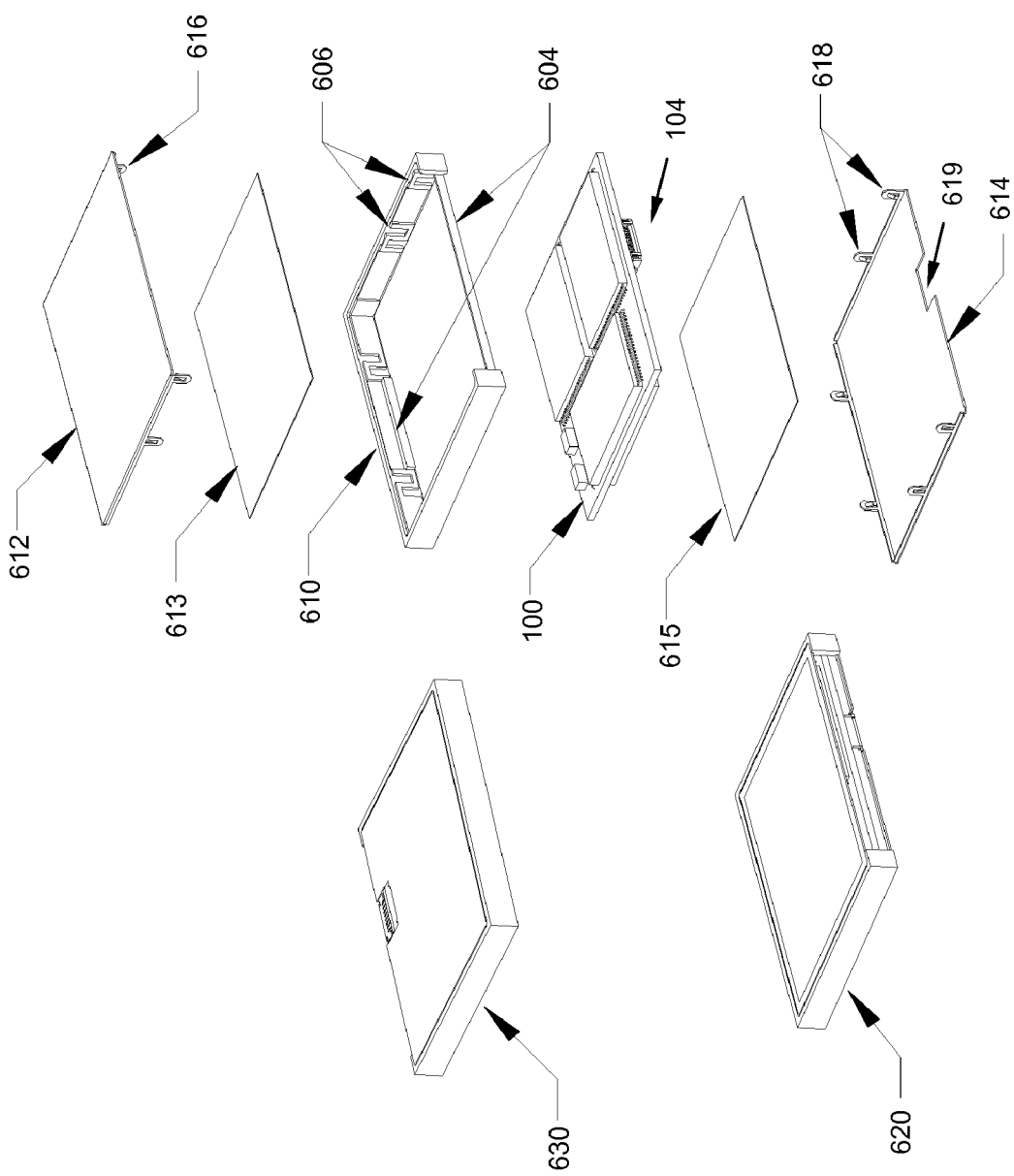
FIG. 6 shows exploded and assembled perspective views of yet another exemplary housing structure with the SSD core unit of FIG. 1A mounted thereon, according to a fifth embodiment of the present invention.

Referring to FIG. 6, in which a perspective view of still another exemplary housing structure and the SSD core unit 100 is shown in accordance with a fifth embodiment of the present invention. The housing structure of the fifth embodiment includes a top metal plate 612, a top electric insulation sheet 612, a plastic frame 610, a bottom electric insulation sheet 615 and a bottom metal plate 614. The top metal plate 612 includes a plurality of connection fingers 616 along rear edge and two side edges. Similarly, the bottom metal plate 614 includes a plurality of corresponding connection fingers 618 along respective edges. The connection fingers 616 and 618 are configured to be snapped into respective engagement slots located inside edges of the plastic frame 610. Also included in the plastic frame 610 are support structures 604 for holding the core unit 100 when assembled. The top 613 and bottom 615 electric insulation sheets are configured to provide electric insulation of electronic components (e.g., non-volatile memory chips) mounted on the core unit 100.

Assembled SSD is shown in top 630 and bottom 620 perspective views. An opening 619 located on the bottom plate 614 is configured to fit the connector 104.

Figure 7:
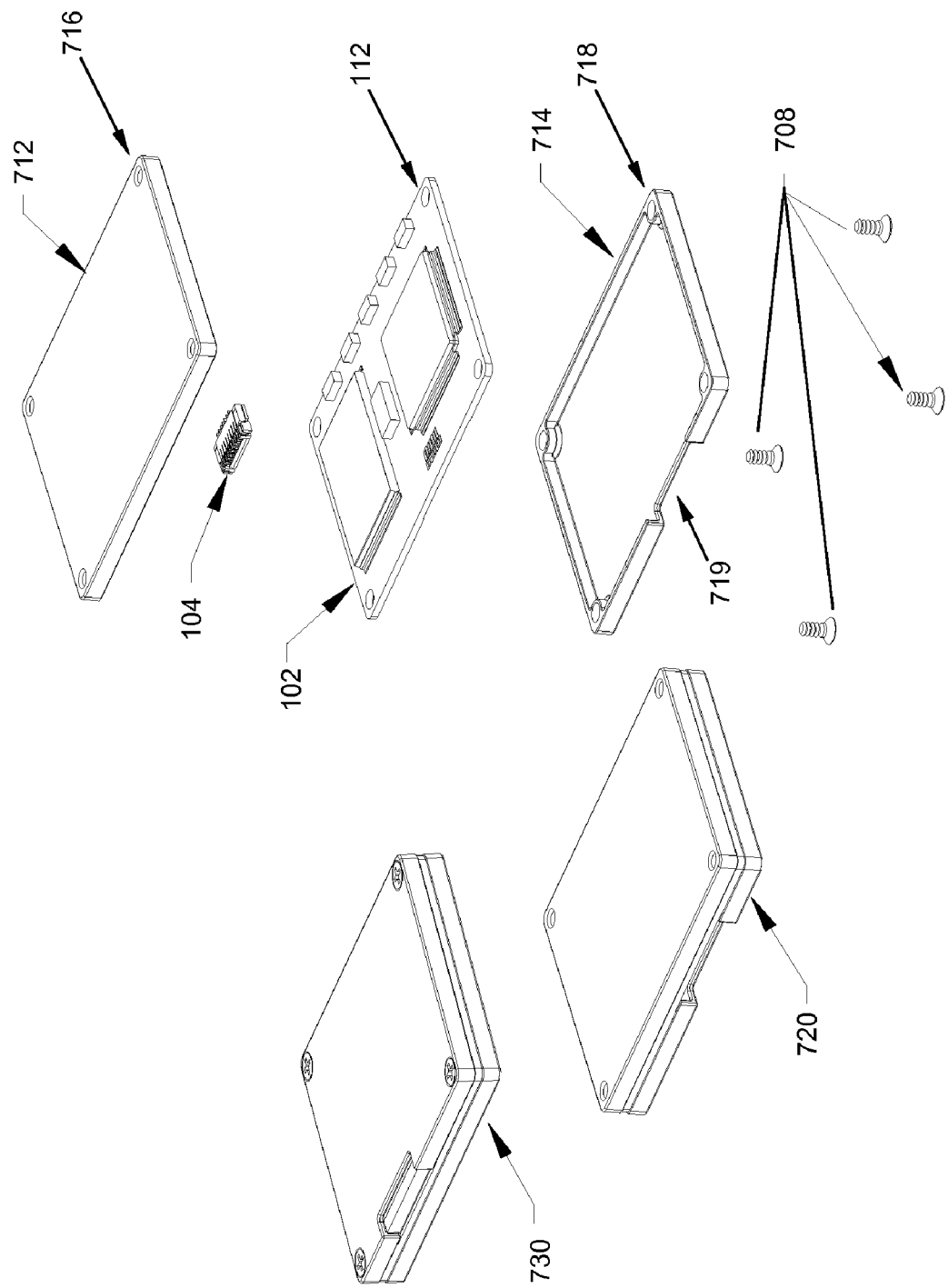
FIG. 7 shows exploded and assembled perspective views of yet another exemplary housing structure with the SSD core unit of FIG. 1A mounted thereon, according to a sixth embodiment of the present invention.

FIG. 7 is a perspective view of yet another exemplary housing structure with the SSD core unit 100 mounted thereon, according to a sixth embodiment of the present invention. The housing structure of the sixth embodiment includes a top cover 712 and a bottom cover 714. In the corners of the top cover 712, there are four fastener holes 716. Similarly, four fastener holes 718 are located in corresponding corners of the bottom cover 714. The fastener holes 716 and 718 are so located that the alignment holes 112 on the core unit 100 are aligned for the four fasteners 708 (e.g., screws). The SSD is assembled by placing the core unit 100 in between the top 712 and bottom 714 covers. Then the fasteners 708 are used to connect the top and bottom covers through aligned top and bottom fastener holes, and through the alignment holes on the core unit 100. The final assembled SSD is shown in top 730 and bottom perspective views. An opening 719 configured for accessing the connector 104 is located on the bottom cover 714.

Finally, FIG. 8 is a perspective view of a PCBA 802 of an SSD with a flat flex cable connector 804. Top and bottom perspective views are shown in views 830 and 820, respectively. The flat flex cable connector 804 is alternative to the CE-ATA connector 104. As shown in FIG. 8, the flat flex cable connector 804 is an integral part of the PCBA 802. In another embodiment, the flat flex cable connector 804 may be an integral part of the host device. Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the outside interface has been shown and described as a connector based on the CE-ATA standard, other standards may be used for the invention including, but not limited to, Integrated Development Environment (IDE), Serial ATA (SATA), Parallel ATA (PATA), fiber channel interface circuits, optical connection interface circuits, and Peripheral Component Interconnect-Express (PCI-E). And whereas the form factor of a PCBA has been shown and described as between 0.85 and one inch, other form factors may be used. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A structure for housing a solid state drive (SSD) that includes a printed circuit board assembly (PCBA) with a plurality of electronic components mounted thereon, the structure comprising:
   a pair of brackets each configured to support a PCBA at either side of the PCBA via at least two ledges with corresponding fastener holes pre-configured thereon, the at least two ledges are attached to inside surface of each of the pair of brackets, wherein each of the pair of brackets has a slab shape with a length and a height, the length is parallel to horizontal direction and the height parallel to vertical direction, and wherein the at least two ledges are located at mid-height and orientated substantially perpendicular to the brackets such that the PCBA is supported horizontally;
   a plurality of alignment holes pre-configured on the PCBA corresponding to the respective fastener holes located on the at least two ledges; and
   a plurality of fasteners configured for securely connecting the PCBA to the pair of brackets through the fastener holes and the alignment holes.

2. The structure of claim 1, wherein the pair of brackets is placed in a mirror-image orientation parallel to each other.

3. The structure of claim 1, wherein the pair of brackets is made of sheet metal plate.

4. The structure of claim 3, wherein each of the at least two ledges and the corresponding fastener holes is formed by folding a pre-drilled and pre-cut portion of the brackets.

5. The structure of claim 1, wherein the length is substantially equal to form factor of the PCBA.

6. The structure of claim 5, wherein the form factor is in a range from substantially near 0.85 inch to substantially near 1 inch.

7. The structure of claim 1, wherein the height is substantially equal to combined thickness of the PCBA and the electronic components mounted thereon.

8. The structure of claim 7, wherein the electronic components comprise at least one non-volatile memory integrated circuit chip, a controller chip and at least one passive component including capacitor, resistor, or light emitting diode.

9. The structure of claim 1, wherein the alignment holes are configured as one or more grounding holes when grounding plane of the PCBA is cut through by one of the alignment holes.

10. The structure of claim 9, wherein at least one of the fasteners is configured to provide an electric current path between the brackets and the PCBA when inserted into the grounding holes, thereby reducing electrostatic discharge damage to the PCBA.

11. The structure of claim 1, further comprises an SSD interface connector mounted on front edge of the PCBA.

12. The structure of claim 11, wherein the SSD interface connector is based on industrial standards including, but not limited to, Commercial Electronic-Advanced Technology Attachment (CE-ATA), Serial Advanced Technology Attachment (SATA), Parallel Advanced Technology Attachment (PATA), fiber channel interface circuits, optical connection interface circuits, Integrated Development Environment (IDE), Peripheral Component Interface Express (PCI-E).

13. The structure of claim 1, wherein the pair of brackets is made of plastic material.

14. The structure of claim 13, wherein the fasteners are integral portion of the ledges with a plurality of alignment protrusions that is used for being snapped into the alignment holes of the PCBA.

* * * * *